(12) United States Patent
Kamas et al.

(10) Patent No.: US 6,429,799 B1
(45) Date of Patent: Aug. 6, 2002

(54) METHOD AND APPARATUS FOR ANALOG TO DIGITAL CONVERSION USING TIME-VARYING REFERENCE SIGNAL

(75) Inventors: Linda Argon Kamas; Jochen Rivoir, both of Sunnyvale, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/905,747

(22) Filed: Jul. 14, 2001

(51) Int. Cl.[7] .................................................. H03M 1/12
(52) U.S. Cl. ........................ 341/155; 341/156; 341/158; 341/159; 341/160; 341/152; 341/118; 341/122; 341/161
(58) Field of Search ................................ 341/155, 156, 341/153, 159, 160, 152, 161, 122, 118

(56) References Cited

U.S. PATENT DOCUMENTS

| 4,093,866 A | 6/1978 | Kasdan et al. |
|---|---|---|
| 4,232,302 A | 11/1980 | Jagatich |
| 4,417,233 A | 11/1983 | Inoue et al. |
| 4,774,498 A | 9/1988 | Traa |
| 4,990,917 A | 2/1991 | Kohdaka |
| 5,519,437 A | 5/1996 | Nelvig |
| 5,790,061 A | 8/1998 | Norimatsu |
| 5,877,715 A * | 3/1999 | Gowda et al. ............... 341/118 |
| 5,920,274 A * | 7/1999 | Gowda et al. ............... 341/155 |
| 6,078,444 A | 6/2000 | Vishakhadatta et al. |
| 6,281,828 B1 * | 8/2001 | Kimura et al. ............... 341/155 |

* cited by examiner

*Primary Examiner*—Michael Tokar
*Assistant Examiner*—Lam T. Mai (57) ABSTRACT

A method and apparatus converts an analog signal into a digital representation. The method comprises the steps of generating a quantity N of time-varying reference signals, where N is an integer greater than or equal to one, comparing an amplitude of the analog signal to an amplitude of each of the reference signals to determine whether the analog signal amplitude is greater than, less than or equal to reference signal amplitudes, and producing a timestamp each time the analog signal and reference signal amplitudes are equal. The apparatus comprises a reference signal generator and a quantity N of comparators, each of the comparators being connected to receive the analog signal, separately to receive a different one of the reference signals, and to produce a digital signal. The analog signal may be reconstructed from the digital representation.

24 Claims, 4 Drawing Sheets

METHOD AND APPARATUS FOR ANALOG TO DIGITAL CONVERSION USING TIME-VARYING REFERENCE SIGNAL

CROSS REFERENCE TO RELATED APPLICATIONS

The present invention is related to a co-pending patent application, Ser. No. 09/875,848, filed Jun. 6, 2001 and entitled "Analog to Digital Signal Conversion Method and Apparatus" by inventor Jochen Rivoir, which is incorporated by reference herein in its entirety. The co-pending application and the present application have the same assignee.

TECHNICAL FIELD

The invention relates to processing of analog signals. In particular, the invention relates to analog to digital conversion of analog signals using timestamps of characteristic signal events.

BACKGROUND ART

Analog signals are generated by and/or used in a wide variety of devices and systems. In many of these systems, the analog signals serve as a means of transferring information from one portion of the system to another. Devices that make up systems employing analog signals function to generate, modify, receive and/or detect the analog signals. Examples of systems or devices that make use of analog signals include sensors for monitoring environmental or other system conditions and a wide variety of different communications systems.

In many practical situations encountered in the real world, it is necessary or at least desirable to transform analog signals into a digital representation. This is especially true in cases where digital methodologies are used largely to process and analyze the analog signals. For example, most manufacturers of integrated circuits (ICs) employ some form of automated test equipment (ATE) to test the IC products being manufactured. While ATEs are overwhelmingly implemented based on digital technologies, many of the modem ICs that are being manufactured and tested, produce or use analog output signals. This has become particularly true as modem system-on-a-chip devices are transitioned from the concept to the product phase. The problem for the designers and users of ATEs is how to transform analog signals into a format that can be utilized by the digital ATE. A related problem is the reconstruction of the analog signal from the digital representation.

The conventional approach to converting an analog signal into a digital representation is to use an analog to digital converter (ADC). Conventional ADCs sample the amplitude of the analog signal or waveform at successive, regularly spaced, points in time. The sampled amplitude values are converted to a digital format (i.e., digitized) by one of several approaches well known in the art. Once digitized, the analog signal is represented by a sequence of digital values representing the amplitudes sampled by the ADC. Normally, timing of the digital values in the amplitude sequence is known implicitly from the conversion scheme being used. Among the commonly employed ADC approaches known in the art are the over-sampling converters, such as the delta-sigma modulator-based ADCs, the successive approximation ADCs, and the so-called flash ADCs. Each of these technologies ultimately produces a string of digital words, each word representing a sampled amplitude value in digital form, in a time sequence at regularly spaced time intervals.

The analog signal can be reconstructed from the digital words produced by the conventional ADC using a digital to analog converter (DAC). The DAC 'reads' or processes each successive digital word in the time-sequence and produces an analog voltage level at a DAC output port that corresponds to each of the words. By reading the digital words in a manner that is consistent with the order and timing of the original analog to digital conversion, the DAC can accurately reconstruct the analog signal.

While conventional amplitude sampled analog to digital conversion or amplitude sequence analog to digital conversion can provide high fidelity conversion of analog signals to a digital form, the conventional ADCs can be costly to implement in some instances. In particular, many of the conventional ADC technologies are not well suited for simple, accurate on-chip implementations. This is especially true when considering on-chip conversion of analog signals for built-in-self-test (BIST) purposes or in design for test (DFT) instances used in conjunction with an external digital ATE. Similarly, the use of conventional ADC approaches as an interface between an analog device and an ATE can pose many problems, not the least of which is the need for extra dedicated resources in the ATE to accommodate the often high data rate digital signals generated by a conventional time-sampling ADC. Finally, the bandwidth of many conventional ADCs is severely limited by the circuitry necessary to affect the analog to digital conversion, especially when many bits of amplitude accuracy are desired.

Accordingly, it would be advantageous to have a method and apparatus for transforming an analog signal into a digital representation that preserved key characteristics of the analog signal and that could optionally provide for accurate signal reconstruction from the digital representation. In addition, it would be beneficial if such a method and apparatus could be applied to any analog signal, had high bandwidth capability, and could be implemented efficiently either on-chip or off-chip. Such a method and apparatus would solve a long-standing need in the area of analog to digital signal conversion, especially as the conversion relates to processing and testing of analog signals by digital systems such as ATEs.

SUMMARY OF THE INVENTION

The present invention is a novel method and apparatus for converting analog signals into a digital representation consisting of timestamps. The digital representation of the analog signal produced by the method and apparatus of the present invention is based on a time sequence and not on a conventional amplitude sequence. Instead, the method and apparatus of the present invention produces a sequence of digitized time samples at or corresponding to the occurrence of a set of predetermined amplitude events within the analog signal. In other words, the present invention maps the analog signal to a series of events and records the time of occurrence of these events. The events according to the present invention are defined by an amplitude relationship between an analog signal or signal under test (SUT) and one or more time-varying reference signals. The time record of the occurrence of the events produced by the method and apparatus of the present invention is, or at least can be thought of as, a sequence of timestamps. The timestamp sequence generated for an analog signal by the method and apparatus of the present invention combined with knowledge of the events associated with the timestamp sequence can provide enough information to allow the reconstruction of the signal from the timestamps.

In one aspect of the present invention, a method of converting an analog signal into a timestamp representation is provided. In particular, the analog signal may be either a signal produced at an output of a device under test, a signal internal to the device under test, or a signal received from an unspecified analog signal source. The method comprises the step of generating a quantity N of timing-varying reference signals. The quantity N is an integer equal to or greater than one. The method further comprises the step of comparing the analog signal to the quantity N of time-varying reference signals. During the step of comparing a determination is made as to whether an amplitude of the analog signal is greater than, equal to, or less than one or more of amplitudes of the N time-varying reference signals. The method further comprises the step of producing a timestamp each time the analog signal amplitude is determined to be equal to the amplitude of one of the time-varying reference signals. The method of converting further comprises an optional step of storing the timestamps and an optional step of reconstructing the analog signal from the timestamps. Furthermore, the step of comparing comprises either simultaneously comparing the analog signal to the quantity N of reference signals in parallel or sequentially comparing the analog signal to each one of the quantity N of reference signals until all of the reference signals have been compared.

In a preferred embodiment, the step of producing a timestamp comprises the step of establishing logic levels in a quantity N of digital signals, one digital signal corresponding to each different one of the N reference signals. A first logic level is established separately in each of N digital signals while the analog signal amplitude is greater than the amplitude of corresponding ones of the N reference signals. A second logic level is established separately in each of the digital signals while the analog signal amplitude is less than the amplitude of the corresponding ones of N reference signals. A transition between the first and second logic levels in the digital signal is a timestamp that marks the time when the analog signal amplitude equals the amplitude of the corresponding reference signal.

In the preferred embodiment, the method of converting an analog signal still further comprises the optional step of measuring and creating a digital timestamp corresponding to the time of transition between the first and second logic levels. In another embodiment, the timestamp produced in the step of producing is a digital word generated directly from the results of the step of comparing. For example, the digital word may be generated by a timing interval analyzer (TIA).

The steps of producing and comparing are performed until the digital signal comprises representations for a plurality of analog signal amplitude events. In general, how many amplitude events are included in the plurality is determined by a tradeoff between test time and test quality. One skilled in the art can readily determine for a given test situation and a given signal under test a sufficient number of amplitude events for the plurality without undue experimentation.

In another aspect of the invention, an apparatus for converting an analog signal into a quantity N of digital signal representations is provided. In particular, the analog signal may be either a signal produced at an output of a device under test (DUT), a signal internal to the DUT, or a signal received from an unspecified analog signal source. The apparatus comprises an apparatus input, a reference signal source, a quantity N of comparators and a quantity N of apparatus outputs, where N is an integer equal to or greater than one. The reference signal source generates a quantity N of time-varying reference signals, the reference signals being different from one another. Each comparator has a first input, a second input and an output. The first input of each comparator is connected to the apparatus input and receives an analog signal, wherein the amplitude of the analog signal varies as a function of time. The second input of each comparator receives a different one of the quantity N reference signals generated by the reference signal source. Each comparator produces a digital signal at the comparator output. The output of each comparator is connected to a different one of the N apparatus outputs. The apparatus can be implemented as a stand-alone unit or it can be incorporated into a device as part of onboard built-in-test circuitry.

In an alternate embodiment, an apparatus for converting an analog signal into a digital signal representation is provided. In the alternate embodiment, the apparatus comprises an apparatus input, a reference signal source, a comparator and an apparatus output. The reference signal source sequentially generates a quantity N of time-varying reference signals, each reference signal in the sequence being different from other ones of the reference signals and each reference signal being generated for a finite period of time. The comparator has a first input, a second input and an output. The first input of the comparator is connected to the apparatus input and receives an analog signal, wherein the amplitude of the analog signal varies as a function of time. The second input of the comparator is connected to the reference signal source and receives the sequence of reference signals generated by the reference signal source. The comparator produces a digital signal at the comparator output, the digital signal being dependent on a comparison between the analog signal and each of the reference signals sequentially with respect to time. The apparatus can be implemented as a stand-alone unit or it can be incorporated into a device as part of onboard built-in-test circuitry.

In yet another aspect of the present invention, a system for converting an analog signal into a digital representation is provided. The system comprises the analog to digital conversion apparatus of the present invention. The apparatus has an input that receives an analog signal and a quantity N of apparatus outputs, where N is an integer equal to or greater than one. The apparatus compares the analog signal to a quantity N of time-varying reference signals and produces one of a quantity N of digital signals at each apparatus output. The logic states of the digital signals are determined by the comparisons. The system further comprises a quantity N of transition interval analyzers (TIAs). Each TIA has an input and an output, such that each apparatus output is connected to the input of one TIA. Each TIA encodes timing of logic transitions in a respective digital signal. Optionally, the system further comprises a test system for testing a device under test having a quantity N of ports. Each port of the test system is connected to the output of one TIA. The test system uses the encoded timing information in the digital signals from the TIAs as timestamps of events in the analog signal to determine if the device under test meets specifications.

BRIEF DESCRIPTION OF THE DRAWINGS

The various features and advantages of the present invention may be more readily understood with reference to the following detailed description taken in conjunction with the accompanying drawings, where like reference numerals, designate like structural elements, and in which.

MODES FOR CARRYING OUT THE INVENTION

The present invention is a novel method and apparatus of converting an analog signal S(t) into a digital representation, the digital representation comprising a sequence of timestamps. In addition, the method and apparatus of the present invention facilitate testing of a device under test (DUT) that generates an analog signal either as an output signal or as a signal internal to the DUT. The digital representation produced by the method and apparatus of the present invention records as timestamps the time of occurrence of a plurality of amplitude events within the analog signal. The amplitude events are defined by time-varying amplitudes of one or more reference signals. As such, the digital representation of the analog signal amplitude events can be viewed as an analog timestamp representation of the analog signal.

The timestamp representation and information regarding the reference signal or signals can be used to reconstruct a sampled analog signal from the timestamp based digital representation. Among other things, the reconstructed analog signal can then be used by a test system to evaluate the signal itself or to evaluate the performance of a DUT that produced the signal. Alternatively, the timestamps can be used directly, without analog signal reconstruction, to test or evaluate the analog signal and/or the DUT. Such testing can include, but is not limited to, pass/fail testing and/or analog characteristic testing based on device specifications and signature analysis. The term 'signature analysis' as used herein refers to comparing timestamps produced for the DUT to equivalent timestamps produced for a device that is known to be a 'good device'. By 'good device' it is meant that the device operates in accordance with device specifications.

The analog signal S(t) is defined for the purposes of discussion herein as a signal having an amplitude s(t) that varies or takes on non-discrete values as a function of time. Preferably, the analog signal has a time-varying signal amplitude s(t) that can be described by a continuous function of time. More preferably, the time-varying signal amplitude s(t) can be described by a smooth, continuous function of time. The term 'smooth' as used herein with reference to a function of time means that at least the first derivative with respect to time of the function describing the time-varying signal amplitude s(t) exists and is defined for all time t greater than zero but less than a maximum time $T_{max}$.

Figure 1:
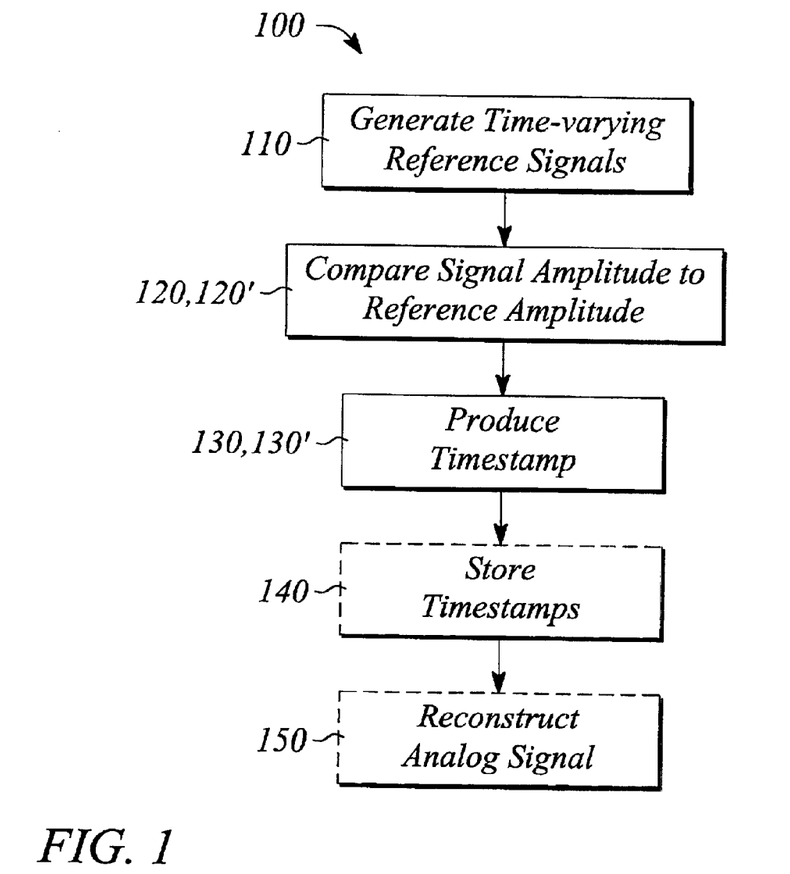
FIG. 1 illustrates a flow chart of a method of converting an analog signal into a digital representation using an analog to time conversion of the present invention.

In one aspect of the invention, a method of converting 100 an analog signal S(t) into a digital signal representation is provided. FIG. 1 illustrates a flow chart of the method of converting 100 of the present invention. The method of converting 100 comprises the step of generating 110 a quantity N of time-varying reference signals $R_i(t)$, where i=1, ..., N and N is equal to or greater than one. Each member of the quantity N of time-varying reference signals $R_i(t)$ is different from one another. Thus, an i-th reference signal $R_i(t)$ is not equal to aj-th reference signal $R_j(t)$ for all i ≠j, where i, j=1, ..., N.

Individually, the time-varying reference signal $R_i(t)$ of the quantity N of reference signals can be any signal having an amplitude that varies or takes on non-discrete values as a function of time in a manner that is known a priori. That is to say the reference signal $R_i(t)$ is a 'known' signal. Preferably, the i-th time-varying reference signal $R_i(t)$ has a time-varying signal amplitude $r_i(t)$ that can be described by a waveform that is a continuous function of time. In general, the waveform may be either periodic, repeating with a period T, or a periodic, non-repeating. In practice, periodic waveforms are preferred since periodic waveforms are easier to generate 110 than a periodic waveforms. More preferably, a waveform or waveforms are chosen that can be easily and inexpensively generated 110.

In addition, although not required, it is preferable that the time-varying signal amplitudes $r_i(t)$ of the reference signals $R_i(t)$ span an expected amplitude range of the analog signal S(t). Spanning the expected range helps to insure that the analog signal S(t) is adequately sampled by the reference signals $R_i(t)$. The time-varying signal amplitudes $r_i(t)$ span an expected amplitude range of the analog signal S(t) if at least one of the reference signals $R_p(t)$ has a minimum amplitude value $r_p(t)=rmin_p$ that is less than or equal to an expected minimum value smin of the amplitude s(t) of the analog signal S(t) and at least one of the reference signals $R_q(t)$ has a maximum amplitude value $r_q(t)=rmax_q$ that is greater than or equal to an expected maximum value smax of the amplitude s(t) of the analog signal S(t).

Examples of waveforms suitable for use in describing the time-varying reference signal $R_i(t)$ include, but are not limited to, a sine wave, a sawtooth wave, a triangle wave, a chirp, a ramp, a square wave, a multi-level stepped wave, and a wave having a pseudo-random amplitude variation with respect to time. Generally, waveforms having finite slope such as a sine wave or a chirp are preferred since discontinuities in the slope or regions of non-finite slope can introduce ambiguities in the digital representation. Waveforms such as the sawtooth wave that do have one or more regions of non-finite slope can be used in conjunction with the present invention by removing timestamps associated with time intervals of the regions of non-finite slope. Time gating is one approach to removing timestamps generated during regions of non-finite slope in the reference signal $R_i(t)$ waveform. One skilled in the art would readily identify other suitable waveforms for use in defining the reference signal $R_i(t)$. All such time-varying reference signal $R_i(t)$ waveforms are within the scope of the present invention.

The method of converting 100 further comprises the step of comparing 120 the analog signal S(t) to each reference signal $R_i(t)$ in the quantity N of reference signals. During the step of comparing 120 the analog signal amplitude s(t) is compared to each of the reference signals $R_i(t)$ in the quantity N of reference signals. A determination is made as to whether the analog signal amplitude s(t) at a time of comparison $t_c$ is either greater than, less than, or equal to the time-varying signal amplitude $r_i(t)$ of the reference signal $R_i(t)$.

The comparisons 120 may be done either in parallel by simultaneously comparing 120 the analog signal amplitude s(t) to all N of the reference signal amplitudes $r_i(t)$ or sequentially by comparing 120' the analog signal amplitude s(t) to a first reference signal amplitude $r_i(t)$ followed by comparing 120' the analog signal amplitude s(t) to a second reference signal amplitude $r_2(t)$ and so on, until the analog signal amplitude $s(t)$ has been compared to the N-th reference signal amplitude $r_N(t)$. In the case where the analog signal $S(t)$ is a periodic signal, the step of sequentially comparing 120' may comprise comparing 120' the analog signal amplitude $s(t)$ to different ones of the reference signal amplitudes $r_i(t)$ during successive of periods of the analog signal $S(t)$.

Preferably, the step of comparison 120, 120' is performed continuously or nearly continuously with respect to time. In other words, a time difference between two adjacent times of comparison $t_{c1}$, $t_{c2}$ called a 'comparison interval' is preferably small and more preferably very small. The step of comparing 120, 120' can be viewed as a conversion of the analog signal $S(t)$ to a time representation where 'time' is the time of occurrence of a crossing or an equality event. The crossing or equality event occurs when the analog signal $S(t)$ amplitude $s(t)$ crosses or is equal to the reference signal $R_i(t)$ amplitude $r_i(t)$.

The method of converting 100 further comprises the step of producing 130 a timestamp corresponding to the time of occurrence of a given reference signal $R_i(t)$ and analog signal $S(t)$ equality event. Thus, a timestamp is produced 130 each time the amplitude $s(t)$ of the analog signal $S(t)$ is observed to be equal to or to cross the amplitude $r_i(t)$ of one of the reference signals $R_i(t)$, resulting in a sequence of timestamps. The sequence of timestamps can be represented as a set of N sequences of timestamps, each sequence consisting of time values $t_k$ where k=1, ..., K, and where K is greater than or equal to one. Since each of the reference signals $R_i(t)$ is known a priori, the amplitude values $r_i(t_k)$ are also known for all time values $t_k$. Thus, the sequence of timestamps corresponds to a sequence of amplitude values $s(t_k)$ of the analog signal $S(t)$. The steps of comparing 120 and producing 130 are repeated for all time t less than the maximum time $T_{max}$. Essentially, the step of producing 130 can be viewed as a conversion from a time representation to a digital representation.

Figure 2:
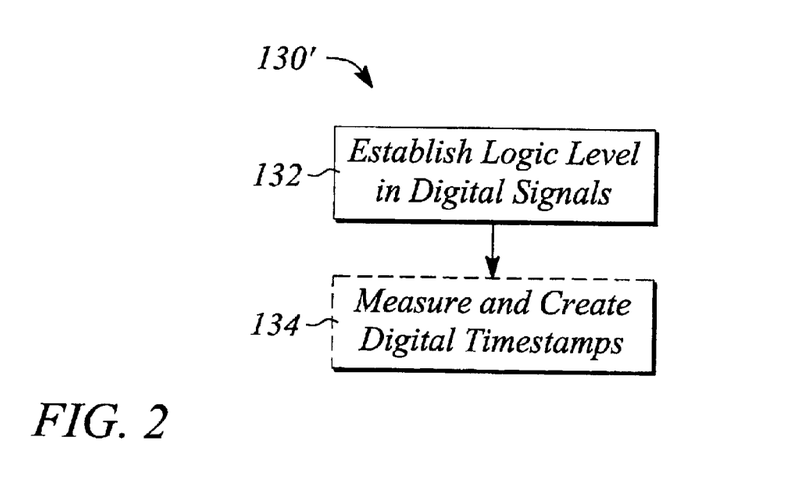
FIG. 2 illustrates a flow chart of a preferred embodiment of the step of producing a timestamp of the method illustrated in FIG. 1 according to the invention.

In a preferred embodiment of the method 100, the step of producing 130' timestamps introduces logic transitions in a quantity N of digital signals $D_i$, where the relative timing of the logic transition represents the timestamps. A flow chart of the preferred embodiment of the step of producing 130' is illustrated in FIG. 2. The step of producing 130' comprises the step of establishing 132 a logic level in each of the digital signals $D_i$. Each of the digital signals $D_i$ is a time-varying signal having an amplitude $d_i(t)$ that preferably can take on only one of two allowed logic states or levels at any given point in time t. During the step of establishing 132, a first one of the logic levels is created 132 in the i-th digital signal $D_i$ when the analog signal amplitude $s(t)$ is greater than the i-th reference signal amplitude $r_i(t)$. A second one of the logic levels is created 132 in the i-th digital signal $D_i$ when the analog signal amplitude $s(t)$ is less than the i-th reference signal amplitude $r_i(t)$.

Note that, since the analog signal amplitude $s(t)$ and i-th reference signal amplitude $r_i(t)$ are both described by a continuous functions of time t, the amplitude $d_i(t)$ of the i-th digital signal $D_i$ can likewise be described by a continuous function of time t. Moreover, if it is assumed that the analog signal amplitude $s(t)$ at some times exceeds the i-th reference amplitude $r_i(t)$, while at other times it does not exceed the i-th reference amplitude $r_i(t)$, the i-th digital signal amplitude $d_i(t)$ will spend a portion of time t at the first logic level and another portion of time t at the second logic level. Furthermore, the points in time t at which the i-th digital signal amplitude $d_i(t)$ transitions between logic states will correspond to points in time $t=t_k$ when the analog signal amplitude $s(t)$ either changes from being greater than to less than the i-th reference amplitude $r_i(t)$ or changes from being less than to greater than the i-th reference amplitude $r_i(t)$. Thus, as a result of the application of the method of converting 100 of the present invention, a logic transition is induced in the i-th digital signal $D_i$ at a time $t=t_k$ that corresponds to the time when the analog signal amplitude $s(t)$ crosses the reference amplitude $r_i(t)$ (i.e. an i-th equality event). Thus, the transitions serve as timestamps of the equality events.

The step of producing 130' of the preferred embodiment of method 100 further comprises the optional step of measuring and creating 134 digital timestamps for the logic transitions in the i-th digital signal $D_i$. The optional step 134 is illustrated as a box having a dashed-line border in FIG. 2. The optional step of measuring and creating 134 measures the time of occurrence $t_k$ of a logic transition in the i-th digital signal $D_i$ and converts the time of occurrence $t_k$ of a transition in a format suitable for storing in a computer memory. The converted time of occurrence $t_k$ of a transition is a digital timestamp. A preferred conversion is a binary encoding of elapsed time based on a timing clock. The optional step of measuring and creating 132 is repeated for each logic transition in each of the digital signals $D_i$. Optionally, additional information may be added to digital timestamps to distinguish timestamps of an i-th digital signal $D_i$ from those of aj-th digital signal $D_j$.

The method 100 of converting optionally further comprises the step of storing 140 the timestamps. The optional step of storing 140 saves the timestamps for later processing. The timestamps can be optionally stored 140 in computer memory. The step of storing 140 is optional since instead the timestamps can be used immediately once they have been produced 130, 130'. The optional step of storing 140 is illustrated as a box having a 'dashed-line' border in FIG. 1.

Figure 3:
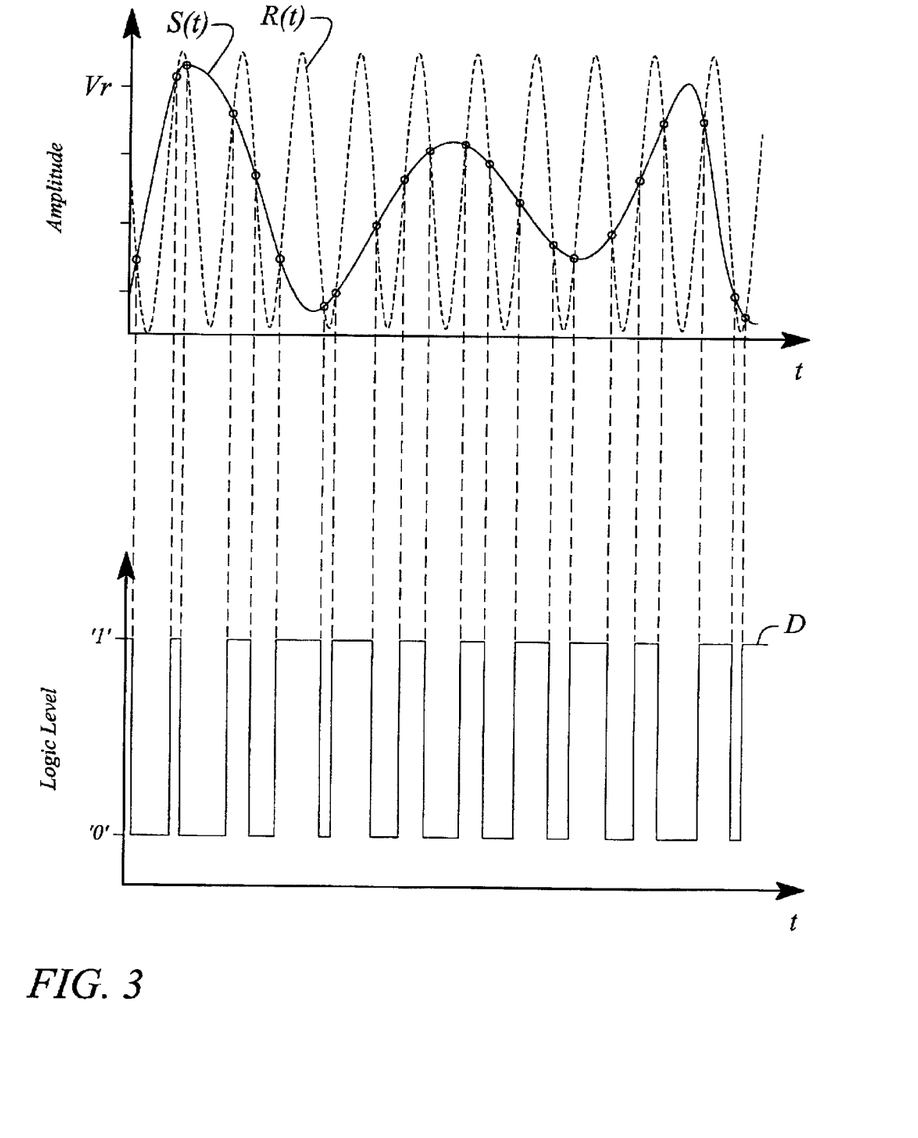
FIG. 3 illustrates a graphical representation of the analog to time conversion of an analog signal into a digital signal representation according to the method illustrated in FIG. 1.

Consider the example illustrated in FIG. 3 in which a single reference signal $R(t)$ is employed (i.e., N=1) to analyze an analog signal $S(t)$. The reference signal $R(t)$ is illustrated as a dashed-line sine wave and the analog signal $S(t)$ is illustrated as a solid line wave. The amplitude $s(t)$ of the analog signal $S(t)$ repeatedly exceeds and then is less than the amplitude $r(t)$ of the reference signal $R(t)$. A sine wave is used for the reference signal $R(t)$ in the example illustrated in FIG. 3 for illustrative purposes only and is in no way intended to limit the scope of the present invention.

Furthermore for this example assume that, if during the step of comparing 120 it is determined that the analog signal amplitude $s(t)$ is greater than the reference amplitude $r(t)$, a logic '1' (e.g. d(t)=1) will be produced by the step of producing 130' in an output digital signal D. On the other hand, if it is determined during the step of comparing 120 that the analog signal amplitude $s(t)$ is less than the reference amplitude $r(t)$, a logic '0' (e.g. d(t)=0) will be produced by the step of producing 130' in the output digital signal D. The results of the application of the method of converting 100 to the analog signal amplitude $s(t)$ are illustrated in the lower half of FIG. 3 as digital signal D, which has a logic transition that occurs every time the analog signal amplitude $s(t)$ crosses the reference amplitude $r(t)$. The correspondence between the timing of transitions in the digital signal D and the points where the analog signal amplitude $s(t)$ crosses the reference amplitude $r(t)$ is indicated by the vertical 'dashed' lines in FIG. 3 for convenience of illustration.

As would be readily recognized by one skilled in the art, the choice of which of the two logic values is used to indicate that the analog signal amplitude s(t) exceeds the reference amplitude r(t) is completely arbitrary according to the invention. The example illustrated in FIG. 3 could just as easily have used a logic '0' to indicate that the signal amplitude s(t) was greater than reference amplitude r(t) and a logic '1' to indicate that the signal amplitude s(t) was less than the reference amplitude r(t) and still be within the scope of the invention. Likewise, when the analog signal amplitude s(t) and the reference amplitude r(t) are equal, the effect on the logic state of the digital signal D can be defined arbitrarily to suit a particular application. For example, the case of equality can be arbitrarily defined to produce 130' in the digital signal D one of the two logic states. Alternatively, the case of equality can be left to have an undefined effect on the logic state of the digital signal D since often it can be assumed that amplitudes s(t) and r(t) will not be equal for an extended period. One skilled in the art would readily be able to determine such a definition to suit a particular application. All such definitions are within the scope of the invention.

As described hereinabove, the timestamps produced 130, 130' by method 100 can be optionally stored 140 in computer memory for use at a later time or instead the timestamps can be used immediately after they are produced 130, 130'. One use of the timestamps is to reconstruct the analog signal. Therefore, the method 100 of conversion optionally further comprises the step of reconstructing 150 the analog signal from the timestamp representation. In the optional step of reconstructing 150, knowledge of the reference signals $R_i(t)$ is used along with the produced timestamps 130, 130' to reconstruct an analog representation of the original analog signal S(t). As discussed hereinabove, knowledge of the timestamps and the reference signals $R_i(t)$ provides unambiguous knowledge of the analog signal S(t) at the time represented in the timestamps.

As mentioned hereinabove, the method 100 of the present invention can be viewed as a method of analog to digital conversion that first converts the analog signal to a time representation and then converts the time representation to a digital signal representation. The time representation is the timing associated with an equality event in the step of comparing 120. The digital representation in the preferred embodiment of the step of producing 130' a timestamp is the quantity N of digital signals $D_i$. The time representation is encoded in the digital signals $D_i$ as the time of occurrence of the produced 130' logic transitions. As an analog to digital conversion, the results of the method 100 can contain enough information to reconstruct the analog signal from the digital representation provided the sampling is performed with sufficient resolution. One skilled in the art would readily be able to determine a sufficient resolution for reconstructing a given signal based on a Nyquist Criteria, well known to those skilled in the art, without undue experimentation. Alternatively, the analog to digital conversion of the method 100 of the present invention can be used to perform pass/fail testing and/or related analog characteristic analysis of a DUT based on device specification or to perform signature analysis of an analog signal in a DUT.

Figure 4A:
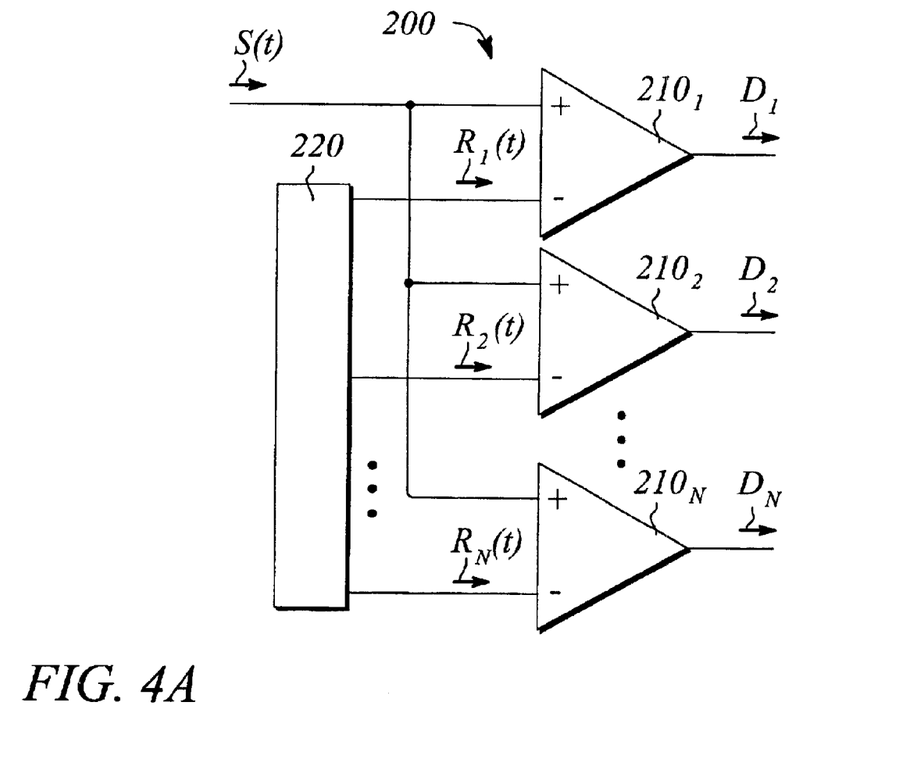
FIG. 4A illustrates a block diagram of one embodiment of an analog to digital conversion apparatus of the present invention.

In yet another aspect of the invention, an analog to digital conversion apparatus 200 is provided. The conversion apparatus 200 accepts an analog signal S(t) and converts the analog signal S(t) into the quantity N of digital signals $D_i$, where i=1, . . . , N and N is greater than or equal to 1. A block diagram of the conversion apparatus 200 is illustrated in FIG. 4A. The conversion apparatus 200 comprises a quantity N of comparators 210$_i$, having a first input, a second input and an output. In an alternate embodiment Schmitt triggers 210'$_i$ (not illustrated) can be used in place of the comparators 210$_i$. In the block diagram illustrated in FIG. 4A, the preferred embodiment of N>1 is shown by way of example only. The first input of each comparator 210$_i$ is labeled '+' and the second input is labeled '−'. The comparator 210$_i$ is a device known in the art that compares the amplitudes of signals on its inputs and produces an output signal on its output, the level of the output signal being determined by relative values of the signals on the inputs. By convention, if a signal amplitude applied to the first input '+' is larger than the signal amplitude applied to the second '−' input, the output of the comparator is 'high'. The apparatus 200 essentially implements the method 100 of the present invention.

For example, an operational amplifier can be used as a comparator 210$_i$ for the apparatus 200 of the invention. An operational amplifier is a device that produces an output voltage that is the amplified difference between a voltage applied to a first input terminal and a voltage applied to a second input terminal. Typical operational amplifiers have very large scale or gain factors that multiply or exaggerate the difference. Thus, if a voltage $V_1$ is applied to the first terminal of an operational amplifier and a second voltage $V_2$ that is less than $V_1$ is applied to the second terminal, the output will be a large value $V_{out} = G \cdot (V_1 - V_2)$, where G is an open loop gain of the operational amplifier. Generally, the value $V_{out}$ will be observed to swing between two voltages determined by the power supply voltages applied to the operational amplifier for very small differences in the voltages $V_1$ and $V_2$. This is exactly what is desired for the quantity N comparators 210$_i$ of the invention. If the voltage $V_1$ is related to the signal amplitude s(t) and the voltage $V_2$ is related to one of the reference signal amplitudes $r_i(t)$, then the operational amplifier will provide the desired comparator function for the apparatus 200. One skilled in the art will readily recognize that there are other suitable approaches for implementing the quantity N comparators 210$_i$. All such suitable approaches are within the scope of the present invention.

Referring again to FIG. 4A, the analog signal S(t) is applied to the first input of each of the comparators 210$_i$. The apparatus 200 further comprises a reference signal source 220 having N outputs. The reference signal source 220 generates a quantity N of reference signals $R_i(t)$, a different one of the set at each of the N outputs. A first reference signal $R_1(t)$ generated by the reference source 220 is applied to the second input of the first comparator 210$_1$. A second reference single $R_2(t)$ is applied to the second input of the second comparator 210$_2$, and so on, until an N-th reference signal $R_N(t)$ is applied to a second input of the N-th comparator 210$_N$. An output signal generated by the first comparator 210$_1$ is the first digital signal $D_i$. An output signal generated by the second comparator 210$_2$ is the second digital $D_2$, and so on, until an output signal generated by the N-th comparator 210$_N$ is the N-th digital signal $D_N$. The digital signal $D_i$ comprises a digital representation or format of the analog signal S(t).

Figure 4B:
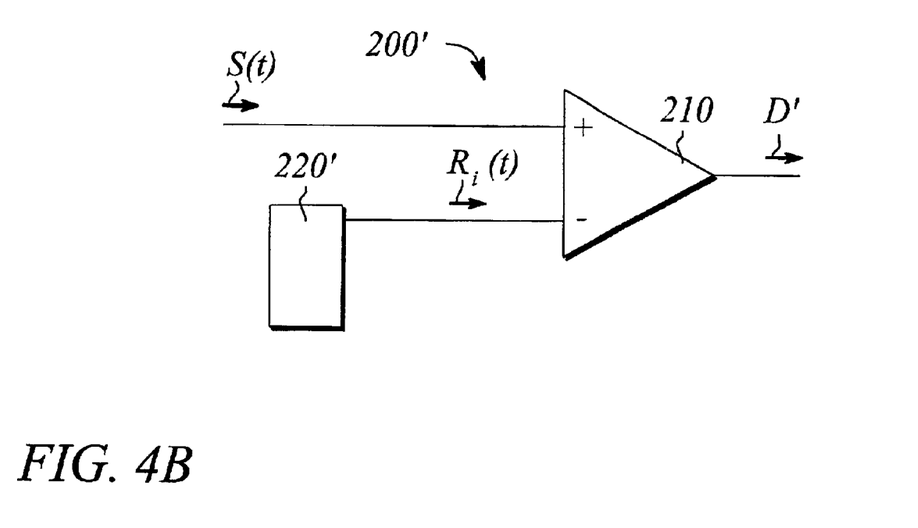
FIG. 4B illustrates a block diagram of another embodiment of an analog to digital conversion apparatus of the present invention.

An alternate embodiment of the conversion apparatus 200' is illustrated in FIG. 4B. The conversion apparatus 200' comprises one comparator 210, having a first input, a second input and an output. A Schmitt trigger 210' (not illustrated) can be used in place of the comparator 210. The analog signal S(t) is applied to the first input of the comparator 210. The conversion apparatus 200' further comprises a reference signal source 220' having one output. The reference signal source 220' output is connected to the second input of the comparator 210. The reference signal source 220' sequentially generates a quantity of N reference signals $R_i(t)$. The arrow labeled '$R_i(t)$' in FIG. 4B indicates the sequence of reference signals $R_i(t)$. Each sequentially generated reference signal $R_i(t)$ is generated and output by the reference signal source 220' for a separate, finite period of time $t_g$. Thus, the first reference signal $R_1(t)$ is generated by the reference signal source 220' and compared to the analog signal S(t) by the comparator 210 for a first period of time. Then the second reference signal $R_2(t)$ is generated by the reference signal source 220' and compared to the analog signal S(t) by the comparator 210 for a second period of time, and so on until the N-th reference signal $R_N(t)$ is generated and compared. If the analog signal S(t) is a periodic signal, the period of time $t_g$ that each of the reference signals $R_i(t)$ is generated by the reference signal source 220' may be, for example, a different period of the analog signal S(t). The output of the comparator 210 is a digital signal representation D' of the analog signal S(t). The digital signal representation D' is indicated by the arrow labeled D' at the comparator output in FIG. 4B. The digital signal representation D' of this alternate embodiment comprises a sequence of digital signal segments $D_i'$ wherein transitions within each segment are timestamps of equality events for a corresponding reference signal $R_i(t)$ comparison.

Figure 5:
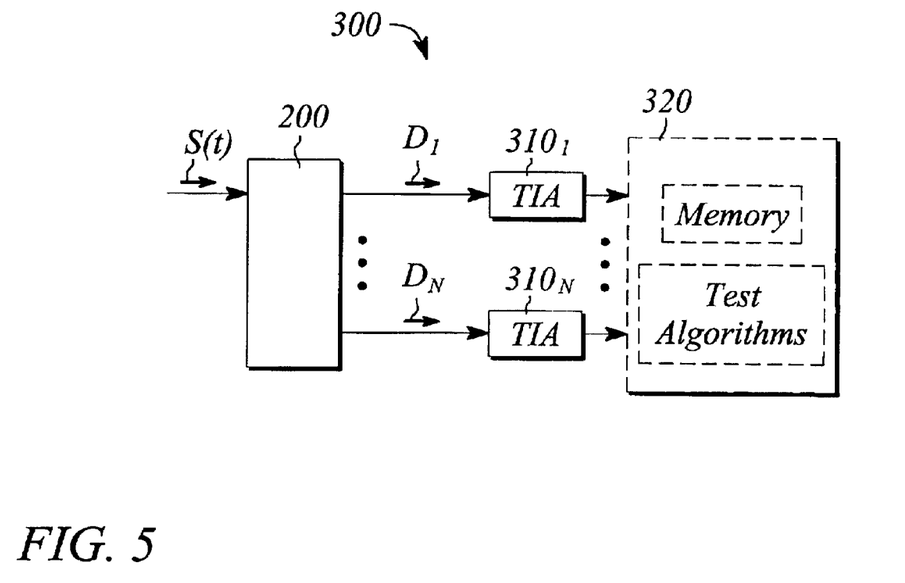
FIG. 5 illustrates a block diagram of a system for testing a device under test using the analog to digital conversion apparatus of the present invention.

In yet another aspect of the invention, a system 300 for converting an analog signal S(t) is provided. Such a system may be used to convert an analog output signal from a device under test (DUT) or from another source. FIG. 5 illustrates a block diagram of the conversion system 300 of the present invention. The system 300 comprises an analog to digital conversion apparatus 200 of the present invention that receives the analog input signal S(t). The conversion apparatus converts the signal S(t) into a quantity N of digital signals $D_i$, where i=1, . . . , N and N is greater than or equal to 1. As noted hereinabove, the conversion performed by the apparatus 200 essentially encodes the timing of certain predefined amplitude events as transitions in the digital signals $D_i$.

Referring again to FIG. 5, the system 300 further comprises a quantity N of transition interval analyzers (TIA) 310$_i$, one TIA 310$_i$ for each digital signal $D_i$ produced by the conversion apparatus 300. The TIA 310$_i$ is a device known in the art that measures the time of occurrence of logic transitions in the digital signals $D_i$. Further, TIAs 310$_i$ are well known in the art of testing DUTs.

The system optionally further comprises a test equipment 320. The optional test equipment 320 is illustrated as a dashed-line box in FIG. 6 for that reason. The optional test equipment 320 may be, for example, an automated test equipment (ATE) system or a similar test system. The test equipment 320 has one or more ports that are connected to the output of a different one of the quantity N TIAs 310$_i$. Each of the TIAs 310$_i$ generates a sequence of digital words that encode the timing of the transitions in the respective digital signals $D_i$. The optional test equipment 320 comprises an optional memory for storing the timestamps and an optional test algorithm for analyzing the timestamps. For example, the optional test equipment 320 might use the encoded timing information of the timestamps to recognize and analyze events in the analog signal S(t). In one application, the analysis may be used to determine if a DUT meets a specification associated with the events encoded by the digital signals $D_i$. In general, the test equipment 320 stores the timestamps in memory and compares them using a test algorithm to expected timestamps or equivalent timing information. The comparison performed by the ATE 320 with the test algorithm can then be used for example, to assess the 'pass/fail' condition of the DUT based on specification for the DUT or to perform signature analysis using expected timestamps produced from a known good device. One skilled in the art would readily be able to choose and configure a TIA 310$_i$ for a given ATE 320 and develop a test algorithm that would be suitable for the testing system 300 of the present invention without undue experimentation.

The system 300 excluding the optional test equipment 320 can be implemented as a stand-alone element. For example, the system 300 can be implemented as a DUT test board that interfaces a DUT to an external ATE system. The system 300 can be integrated into a DUT as part of the 'on board' test circuitry of the DUT. Further, the system 300 can be integrated into an ATE. In a preferred embodiment, the system 300 is integrated into a device (e.g. DUT) as part of the device's built-in test circuitry. More preferably, only the apparatus 200 is built into the device. When only the apparatus 200 is built-in, the TIAs 310$_i$ and optional test equipment 320 including the optional memory/algorithms are typically part of an external test system used to test the device such as an ATE. In other words, the apparatus 200 can be implemented either off-chip or preferably on-chip with respect to the device. An alternate embodiment of the system 300' (not illustrated) comprises all of the elements of the system 300 except for the conversion apparatus 200 which is replaced by the conversion apparatus 200' in the system 300'. For this alternate embodiment, the system 300' comprises a single TIA 310 to receive the digital signal representation D' from the single comparator 210.

Thus, there has been described a novel method 100 of analog to digital conversion using time-varying reference signals. In addition an apparatus 200, 200' for converting an analog signal to a digital representation and a system 300, 300' for converting and testing an analog signal are described. It should be understood that the above-described embodiments are merely illustrative of the some of the many specific embodiments that represent the principles of the present invention. Clearly, those skilled in the art can readily devise numerous other arrangements without departing from the scope of the present invention.

What is claimed is:

1. A method of converting an analog signal into a digital representation comprising the steps of:
    generating a quantity N of time-varying reference signals, where N is an integer equal to or greater than 1;
    comparing an amplitude of the analog signal to an amplitude of each reference signal to determine whether the analog signal amplitude is greater than, less than or equal to each reference signal amplitude; and
    producing a timestamp when the analog signal amplitude equals the amplitude of each reference signal, wherein each timestamp is a record of an amplitude equality event, and wherein the digital representation is a set of timestamps.

2. The method of claim 1, wherein each timestamp comprises a logic level transition in a digital signal.

3. The method of claim 2, further comprising the step of measuring and creating a digital timestamp for each logic level transition in the digital signal.

4. The method of claim 1, wherein the step of comparing comprises simultaneously comparing the analog signal amplitude to each one of the quantity N reference signal amplitudes in parallel.

5. The method of claim 1, wherein the step of comparing comprises sequentially comparing the analog amplitude to each one of the quantity N reference signal amplitudes until all of the reference amplitudes have been compared.

6. The method of claim 1, wherein the analog signal is a periodic signal and wherein during the step of comparing each one of the quantity N reference signals is compared to the analog signal during a different period of the analog signal.

7. The method of claim 2, wherein the step of producing comprises the step of establishing a first logic level in the digital signal corresponding to a respective one of the reference signals when the analog signal amplitude is greater than the respective reference signal amplitude and a second logic level in the corresponding digital signal when the analog signal amplitude is less than the respective reference signal amplitude.

8. The method of claim 1, further comprising reconstructing the analog signal from the set of timestamps and the reference signals.

9. The method of claim 1, further comprising the step of storing the set of timestamps.

10. The method of claim 9, further comprising reconstructing the analog signal from the set of timestamps and the reference signals.

11. A method of converting an analog signal from a device under test into a digital signal representation comprising the steps of:

generating a time-varying reference signal;

comparing an amplitude of the analog signal from the device under test to an amplitude of the reference signal to determine whether the analog signal amplitude is greater than, less than or equal the reference signal amplitude;

producing a first logic level in a digital signal corresponding to the reference signal while the analog signal amplitude is greater than the reference signal amplitude and a second logic level in the digital signal while the analog signal amplitude is less than the reference signal amplitude; and repeating the steps of comparing and producing for a period of time to obtain the digital signal representation of the analog signal from the device under test, wherein the digital signal representation comprises representations for a plurality of amplitude equality events.

12. The method of claim 11, further comprising the step of measuring and creating a digital timestamp for each logic level transition in the digital signal.

13. The method of claim 11, wherein the digital signal representation is used to determine if the device under test meets specifications.

14. The method of claim 11, wherein the digital signal representation is used to perform signature analysis of the device under test.

15. An apparatus for converting an analog signal having an amplitude value to a quantity N of digital signals comprising:

an apparatus input;

a reference signal source having a quantity of N reference signal outputs, where N is an integer equal to or greater than 1, wherein a different one of a quantity N of time-varying reference signals is generated by the reference signal source at each of the reference signal outputs;

a quantity N of comparators each having a first input, a second input and an output, the first input being connected to the apparatus input to receive the analog signal, the second input being connected to a different one of the reference signal outputs of the reference source to receive a different one of the N reference signals, and each comparator producing a respective one of the quantity N digital signals at the comparator output; and a quantity N of apparatus outputs, wherein each comparator output is connected to a different one of the N apparatus outputs, and wherein each one of the produced digital signals comprises a set of timestamps, each timestamp being a record of an amplitude equality event between an amplitude of the analog signal and an amplitude of each reference signal.

16. The apparatus of claim 15, wherein when N is greater than 1, the comparators simultaneously compare the analog signal amplitude to the different reference values in parallel.

17. The apparatus of claim 15, wherein when N is greater than 1, the comparators sequentially compare the analog signal amplitude to the different reference values.

18. The apparatus of claim 15, wherein each comparators is selected from an operational amplifier and a Schmitt Trigger.

19. An apparatus for converting an analog signal having an amplitude value to a digital signal comprising:

an apparatus input;

a reference signal source having a reference signal output, wherein a different one of a quantity N of time-varying reference signals is generated sequentially by the reference signal source at the reference signal output each of the reference signals being generated for a finite period of time and where N is an integer equal to or greater than 1;, a comparator having a first input, a second input and an output, the first input being connected to the apparatus input and receiving the analog signal, the second input being connected to the reference signal output of the reference signal source to receive the sequentially generated reference signals, the comparator producing a digital signal at the comparator output; and an apparatus output, wherein the comparator output is connected to the apparatus output, and wherein the produced digital signal comprises a set of timestamps, each timestamp being a record of an amplitude equality event between an amplitude of the analog signal and an amplitude of each reference signal.

20. A system for converting an analog signal into a digital representation comprising:

an analog to digital conversion apparatus having an input connected to receive the analog signal, and a quantity N of apparatus outputs, where N is an integer equal to or greater than 1, the apparatus producing one of a quantity N of digital signals at each apparatus output, wherein each one of the produced digital signals comprises a set of timestamps, each timestamp being a record of an amplitude equality event between an amplitude of the analog signal and an amplitude of a respective time-varying reference signal; and a quantity N of transition interval analyzers (TIA) each having an input and an output, each apparatus output being connected to the input of a respective TIA, each TIA encoding timing of logic transitions in a respective digital signal.

21. The system of claim 20, further comprising a test subsystem for testing a device under test, wherein the device under test produces the analog signal, the test subsystem having a quantity N of ports, each port connected to the output of a respective TIA, the test subsystem using encoded timing information in each digital signal as timestamps of events in the analog signal to determine if the device under test meets specifications.

22. The system of claim 20, wherein the analog to digital conversion apparatus comprises a quantity N of comparators each having a first input, a second input and an output, the first input being connected to the apparatus input and receiving an analog value of the analog signal, wherein the analog value varies as a function of time, the second input receives a different one of a quantity N of different time-varying reference signals, and each comparator produces a respective one of the digital signals on the comparator output, the comparator output being connected to a respective apparatus output.

23. The system of claim 22, wherein the analog to digital conversion apparatus further comprises a reference signal source producing the quantity N different time-varying reference signals.

24. The system of claim 21, wherein the test subsystem comprises a memory and a test algorithm, wherein the memory stores device specifications and the analog signal timestamps, and wherein the test algorithm compares the analog signal timestamps to expected timestamps derived from the device specifications or from a measurement of a known good device to assess the operational performance of the device under test.

* * * * *